Figure 1:
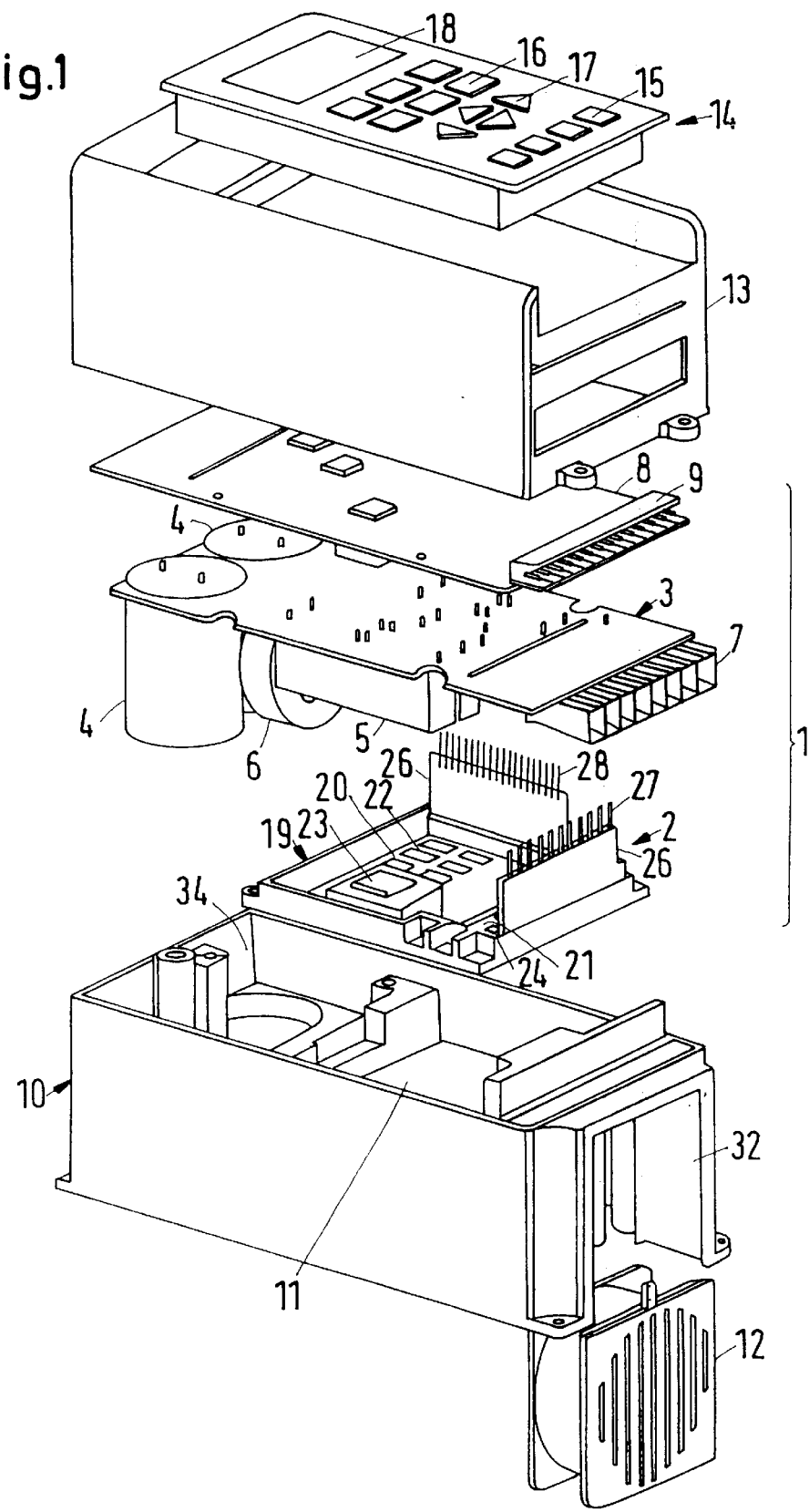

United States Patent [19]
Plougsgaard et al.

[11] Patent Number: 6,091,604
[45] Date of Patent: Jul. 18, 2000

[54] POWER MODULE FOR A FREQUENCY CONVERTER

[75] Inventors: Helge Søe Plougsgaard, Sydals; Klaus Olesen, Sønderborg, both of Denmark

[73] Assignee: Danfoss A/S, Nordborg, Denmark

[21] Appl. No.: 09/273,059

[22] Filed: Mar. 19, 1999

[30] Foreign Application Priority Data

Mar. 27, 1998 [DE] Germany .................... 198 13 639

[51] Int. Cl.⁷ .................................................. H05K 7/20
[52] U.S. Cl. .................... 361/707; 361/704; 361/709; 361/712; 361/713; 361/714; 361/719; 361/720; 361/721; 174/16.1; 174/16.3; 174/52.1; 174/52.3; 165/80.2; 165/80.3; 165/185; 363/141
[58] Field of Search .................... 361/704, 705, 361/707, 712, 717, 718, 719, 736, 752; 257/706, 707; 165/80.3, 185; 174/16.3, 52.2; 363/141

[56] References Cited

U.S. PATENT DOCUMENTS

| | | | |
|---|---|---|---|
| 4,471,407 | 9/1984 | Sleder | 361/707 |
| 4,525,769 | 6/1985 | Lehmann | 361/704 |
| 5,258,888 | 11/1993 | Korinsky | 361/704 |
| 5,365,403 | 11/1994 | Vinciarelli et al. | 361/707 |
| 5,502,618 | 3/1996 | Chiou | 361/695 |
| 5,742,478 | 4/1998 | Wu | 361/704 |
| 5,835,350 | 11/1998 | Stevens | 361/704 |

*Primary Examiner*—Leo P. Picard
*Assistant Examiner*—Boris L. Chevinsky
*Attorney, Agent, or Firm*—Lee, Mann, Smith, McWilliams, Sweeney & Ohlson

[57] ABSTRACT

Power module for a current converter, particularly a frequency converter, having at least one printed circuit board equipped at least with power components and having a heat-conducting connection with a wall of the current converter housing serving as heat sink, the power module having electrically conducting connection parts arranged vertically to the housing wall, which parts laterally confine a chamber and are long enough to enable accommodation of large, passive electrical components, such as capacitors, in the chamber. To ensure a space saving embodiment of the power module, though maintaining a sufficient heat dissipation and simplifying the electrical connection between the power module and the remaining components of the converter, it is provided that the only electrical connection between the power module and other electrical components of the converter as well as to the supply mains and to a load supplied via the converter is established via the connection parts.

6 Claims, 5 Drawing Sheets

POWER MODULE FOR A FREQUENCY CONVERTER

The invention concerns a power module for a current converter, particularly a frequency converter, having at least one printed circuit board equipped at least with power components and having a heat-conducting connection with a wall of the current converter housing serving as heat sink, the power module having electrically conducting connection parts arranged vertically to the housing wall, which parts laterally confine a chamber and are long enough to enable accommodation of large, passive electrical components, such as capacitors, in the chamber.

Such a power module for a frequency converter is known from U.S. Pat. No. 5,610,493. The power module comprises power elements in the form of semiconductor diodes and semiconductor switches forming a three-phase rectifier and a three-phase inverter. As with the current state of the art these semiconductor components have relatively small dimensions, they are arranged in a compact manner on a common printed circuit board. As the power semiconductor components still need intensive cooling, a metal layer arranged on their bottomside provides a thermally conducting contact with a wall of a housing part of the frequency converter, which housing part is made of metal and cooled by a fan. A second printed circuit board electrically connected with the first printed circuit board is arranged over the first printed circuit board and the power components fixed on it. The vertically arranged electrical connection parts mentioned are fixed on the second printed circuit board. In the chamber between the connection parts relatively large capacitors are arranged, which are placed in the DC intermediary circuit of the frequency converter. Additionally, monitoring and control components are arranged on the second printed circuit board. Further, a third printed circuit board is arranged vertically on the second printed circuit board, which third board carries the components of a power supply circuit and further connection parts. A connection module with connections accessible from the outside and connected with the connection parts is arranged on the second printed circuit board.

This embodiment is indeed room saving, however requires a second and a third printed circuit board to provide the complete electrical connection between the power components and the remaining components of the frequency converter. The connection parts arranged vertically on the second printed circuit board only enable a connection to the supply mains and the load in the form of an AC motor. The manufacturing of this connection is expensive, as each connection part must be bent to a right angle before the power module can be connected with the remaining components of the frequency converter.

From DE 43 33 387 C2 is known a power module for a frequency converter, which also carries the power components (semiconductor diodes and transistors) of the frequency converter on a first printed circuit board having thermally conducting contact with a cooling housing part, and is connected with additional printed circuit boards, arranged over the first printed circuit board, and carrying large components, such as capacitors, low-power control components and mains and motor connectors, by means of pins arranged vertically on the first printed circuit board. On the third printed circuit board protecting circuits for the power circuit components in the power module are arranged. To provide the best possible protection, these protecting circuits should be arranged as close to the power circuit components as possible. However, the power circuit components in the power module produce too much heat, so that the protecting circuits cannot be arranged on the same printed circuit board as the power circuit components. Therefore, the protecting circuits are arranged on the upper printed circuit board, which, however, requires more space and provides a poorer protection. Arranging the large, passive components, for example capacitors, on the second printed circuit board also requires much space. The process of connecting is also expensive, as, firstly, the second printed circuit is fixed on the power module by means of guiding projections and screws, and, secondly, spot soldering has to be performed between the laterally arranged connection pins and the second printed circuit board.

The task of the invention is to provide a power module of the kind described in the introduction, having a space saving embodiment though still providing sufficient heat dissipation and a simpler electrical connection between the power module and the remaining components of the converter.

According to the invention, this task is solved in that the only electrical connection between the power module and other electrical components of the converter as well as to the supply mains and to a load supplied via the converter can be established via the connection parts. This solution is space saving, as large passive components can be arranged in the room between the vertical connection parts connecting the printed circuit board carrying the power components and a printed circuit board arranged over that one, in a way that neither the width nor the depth of the unit comprising the current converter is increased. Compared with the state of the art, the connecting printed circuit board arranged vertically to the second printed circuit board is saved, which enables an improved packing tightness. Additionally, this solution permits an easier production, as the power module and the printed circuit board arranged over it are connected in only one soldering process.

Preferably, it is provided that, additionally to the power components, the power module comprises control components, the power and control components being arranged in the same level on a common printed circuit board or on neighbouring printed circuit boards. This causes a further reduction of the total dimensions of the converter.

It is particularly advantageous that the housing wall serving as cooling surface has a cut-out, in which at least some of the control components are arranged to be thermally isolated from the power components. Thus, a further reduction of the dimensions of the current converter in total and of the power module in particular is possible. Thus, at least some of the control components are protected from the heat produced by the power components.

The control components can be arranged in a room saving way on both sides of the common printed circuit board or one of the printed circuit boards.

Further, it may be provided that the power module has an electrically non-conducting housing having connectors for supply mains and the load accessible from the outside, said connecting parts being connected with the connection parts. Thus, additional printed circuit boards with contact banks for the connection to mains supply and consumer can be avoided.

Additionally, the connection parts can be partly embedded in fixed walls. Firstly, these walls strengthen the connection parts, and secondly they serve as support of printed circuit boards being arranged over the first printed circuit board.

Further, it is advantageous that the printed circuit board/s is/are made of ceramics with printed copper conductors.

This gives a particularly efficient heat dissipation and a reduction of the dimensions, as the printed circuit boards carrying the power components also serve the purpose of heat dissipation.

Figure 2:
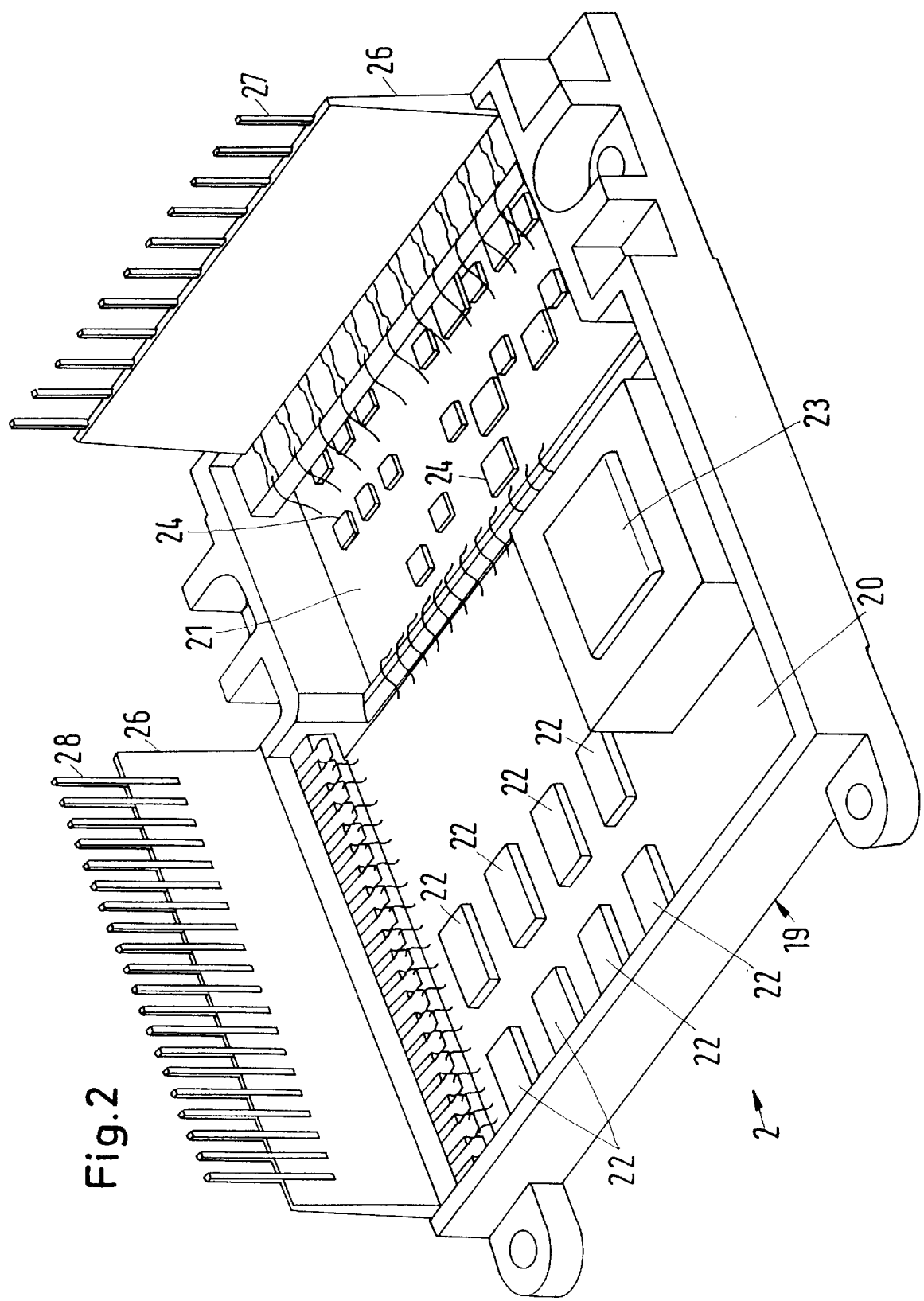

In the following, the invention and its embodiments are described on the basis of drawings of preferred embodiments, showing:

FIG. 1 a first embodiment of a power module according to the invention in a current converter in the shape of an exploded view of a frequency converter FIG. 2 an enlarged perspective view of the power module shown in FIG. 1

Figure 3:
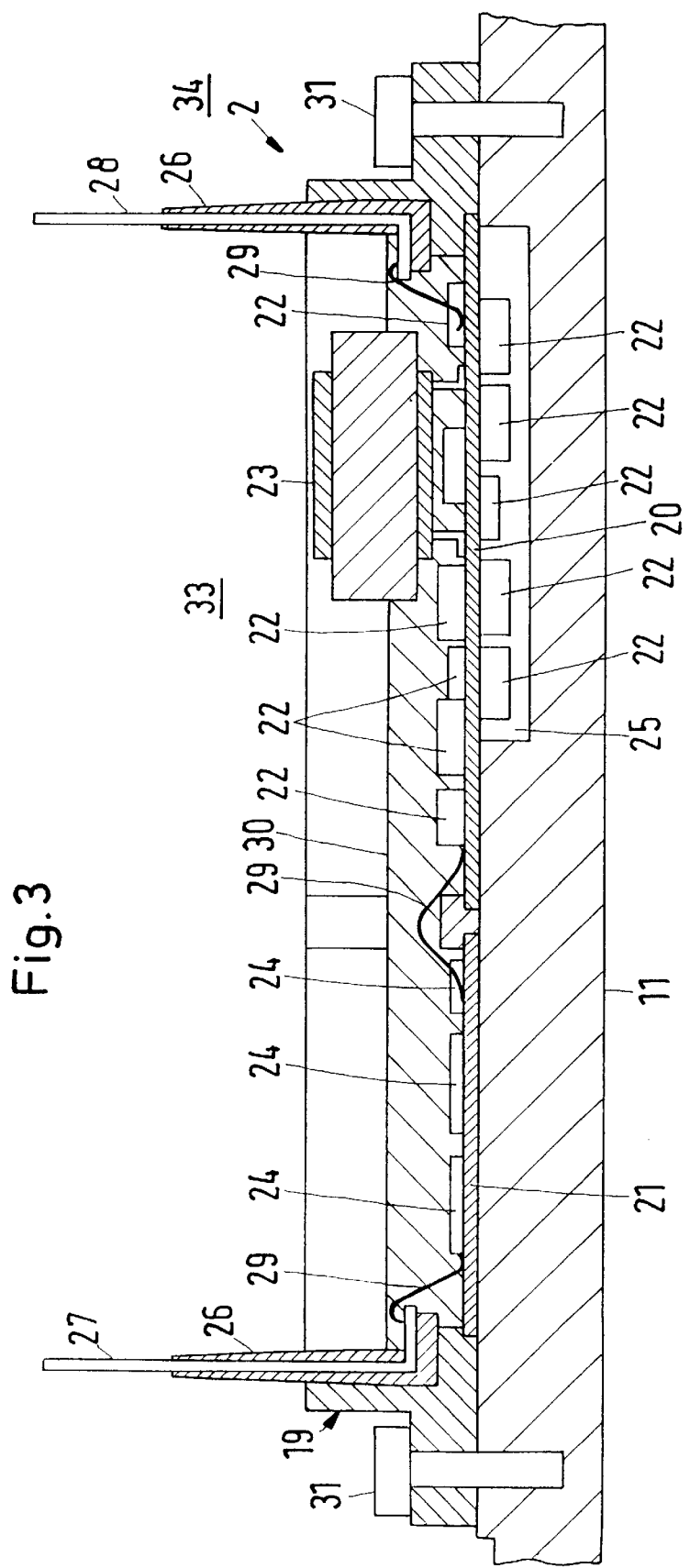
Figure 4:
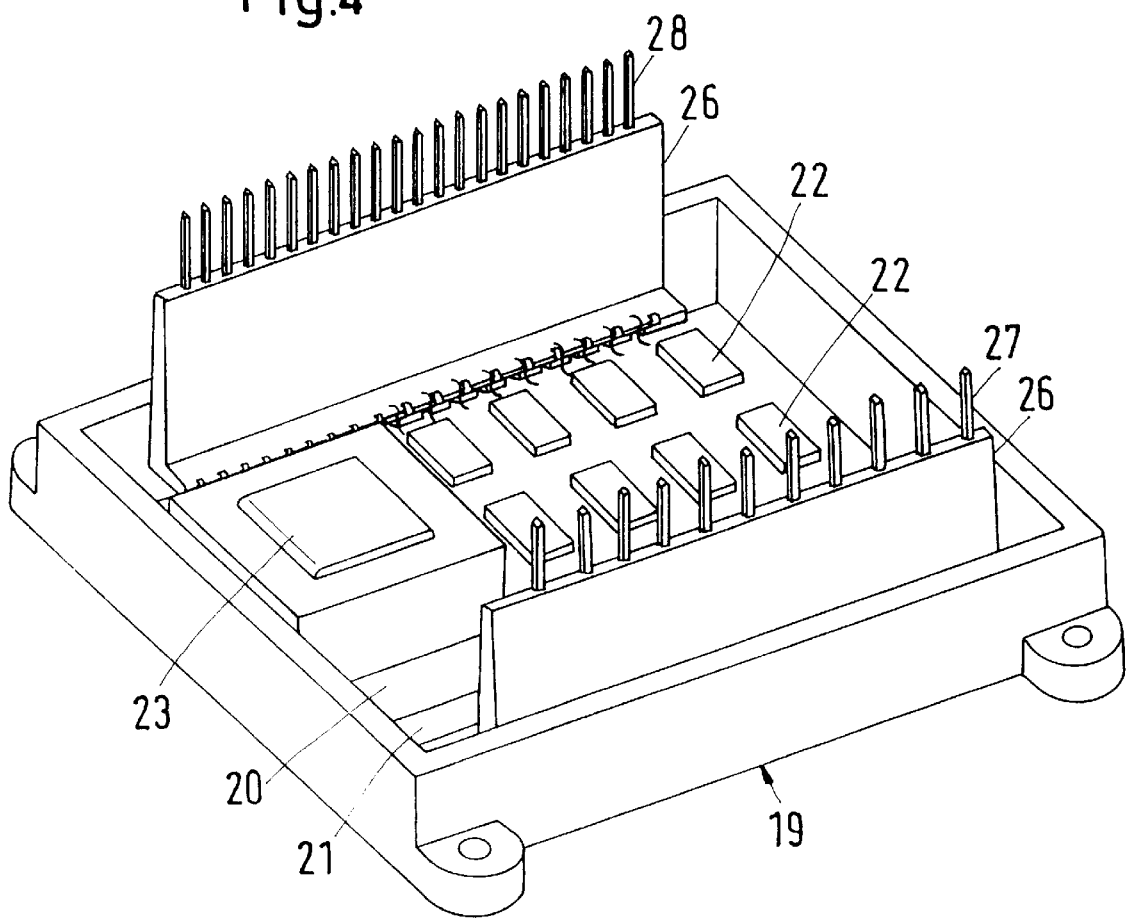

FIG. 3 a vertical section of a modified power module according to FIGS. 1 and 2, and the wall of a metal housing part of the current converter having a cooling arrangement FIG. 4 a perspective view of the power module according to FIG. 3

Figure 5:
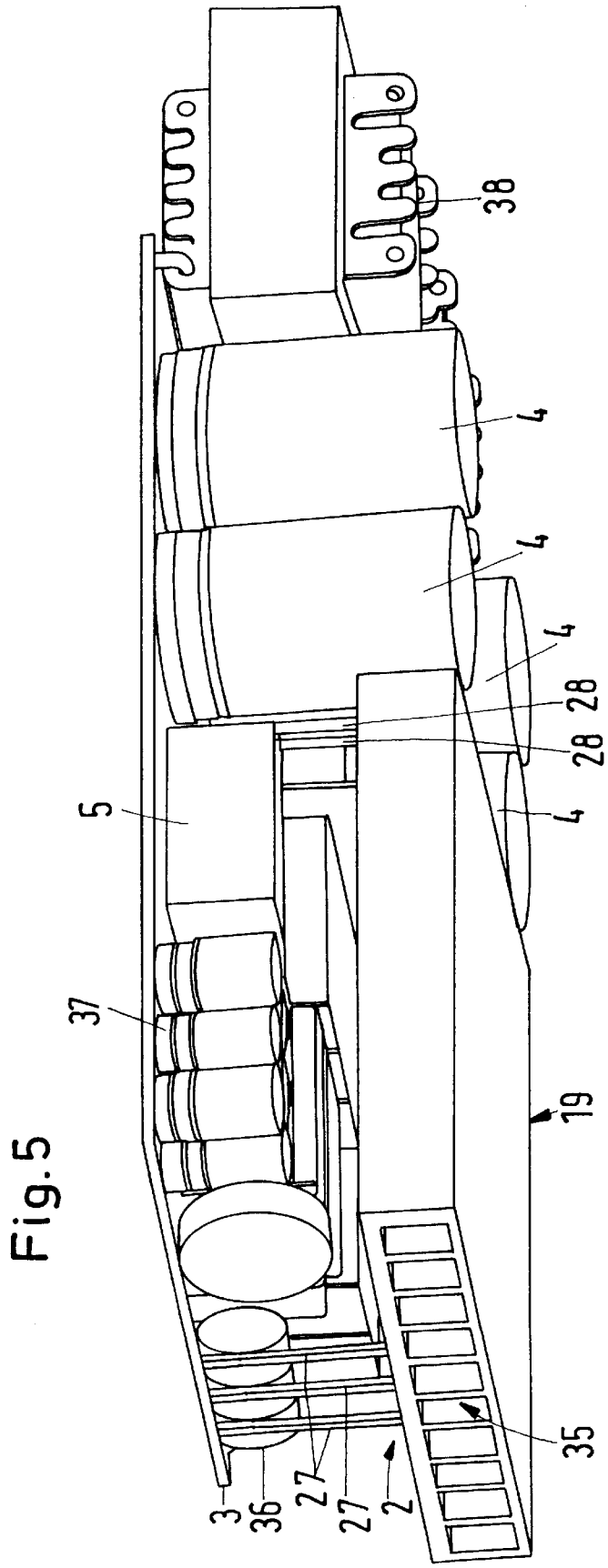

FIG. 5 a further embodiment of a power module according to the invention, showing a further modification of the power modules according to FIGS. 1 to 4, electrically and mechanically connected with a printed circuit board carrying large passive components.

FIG. 1 shows an exploded view of a current converter in the shape of a frequency converter, converting the voltage of an AC supply mains with fixed frequency via a three-phase bridge rectifier made of semiconductor diodes, a DC intermediary circuit comprising smoothing capacitors and smoothing throttle coils, as well as a subsequent inverter comprising controllable semiconductor switches, such as transistors or thyristors, into a three-phase AC voltage with controllable frequency for a three-phase load, preferably an asynchronous motor. The output frequency of the inverter is controllable, to control the speed of the motor. Consequently, the output of the motor is controllable in the range from 0.25 to 7.5 kW. While the semiconductor diodes and semiconductor switches of the bridge rectifier and the inverter form power components carrying high current, the control components provided in the belonging control arrangement are low-powered components carrying only low current. While the power and control components have relatively small dimensions, the dimensions of other passive electrical components, such as those of the DC intermediary circuit, the electrical interference suppression capacitors and the transformators, are much larger.

In the converter shown in FIG. 1, a control and power component 1 comprises a power module 2, a printed circuit board 3 having on its bottom side large passive electrical components, such as capacitors 4 of the DC intermediary circuit, electrical interference suppression capacitors 5, a throttle coil 6 as well as current measuring coils, and a connector 7 with connecting parts accessible from the outside for the connection of motor and current supply mains, an additional printed circuit board 8 as plug-in board with control components as well as a terminal block 9 with inlet and outlet connecting parts for measuring and control signals, for example to and from a microprocessor, a bottom housing part 10 of metal with a heat conducting inner wall 11, in which a ventilator 12 is arranged for cooling, and an upper housing part 13 of metal, having on its upper side a user front panel 14 with operating keys 15 to 17 and a display 18.

The power modules 2 shown in enlarged scale in FIGS. 2 to 4, have a housing 19 injection moulded of an electrically isolating plastic and two printed circuit boards 20 and 21 arranged next to each other, lying in approximately the same level and at the same time forming the bottom of the housing 19. The printed circuit boards 20 and 21 are made of electrically isolating, though heat conducting ceramics having printed conductors on the upper side. As shown in FIG. 3, the printed circuit boards 20 and 21 rest on the wall 11 of the housing part 10, thus providing thermally conducting contact.

Control components 22 are arranged on the upper and lower side of the printed circuit board 20, which control components are connected with the printed conductors on the printed circuit board 20. Further, a transformer 23 is arranged on the upper side of the printed circuit board 20. On the upper side of the printed circuit board 21, power components 24 are connected with the printed conductors. The upper side of the wall 11 comprises a cut-out 25, in which part of the control components 22 are arranged to be thermally isolated from the power components 24.

Additionally, the housing 19 of the power module 2 according to the FIGS. 1 and 2 has, on two sides at right angles to each other, walls 26 extending upwards, in which are embedded pin-like connection parts 27 and 28 projecting vertically to the housing wall 11, in order to strengthen the connection parts 27, 28 and the printed circuit board 3 fixed (attached and soldered) on them.

While the walls 26 of the power module 2 according to the FIGS. 1 and 2 as well as the series of connection parts 27, 28 embedded in them are arranged at right angles to each other, the power module 2 according to the FIGS. 3 and 4 merely differs from the power module 2 according to the FIGS. 1 and 2 in that the walls 26 with the embedded series of connection parts 27, 28 are arranged parallel to each other.

With both embodiments of the power module 2 all connections of the power module 2 to the other components of the current converter, to the supply mains and to the load are realised by means of the connection parts 27 and 28. For this purpose the connection parts 27, 28 are connected with printed conductors of the printed circuit board 3 and also with printed conductors of the printed circuit board 8, some of the connection parts 27, 28 being connected with the terminal block 7 and the remaining connection parts being connected with the terminal block 9. At the same time, the pin-like connection parts 27 and 28 serve as mechanical support for the printed circuit boards 3 and 8, the walls 26 extending from the power module 2 also contributing to the support of these printed circuit boards. As all currents to and from the power module 2 flow through the connecting parts 27 and 28, the connection parts carrying mains and motor current are thicker and broader than those merely carrying control signals.

The control components 22 arranged on the upper side of the printed circuit board 20, the bottom part of the transformer 23 and the power components 24, as well as the printed circuit boards 20 and 21, which are electrically connected through cables 29 connecting them with the connection parts 27 and 28, are embedded in a layer of epoxy resin 30 (FIG. 3). The power module 2 and the printed circuit boards 3 and 8 soldered onto it are inserted in the housing part 10, the housing 19 of the power module being fixed on the wall 11 by means of screws 31. Equally, the upper housing part 13 with the inserted user front panel 15 is screwed onto the lower housing part 10. In advance or finally, the fan 12 is fixed in the lateral opening 32 (FIG. 1) of the lower housing part 10.

In the assembled state of the current converter, large passive components of both embodiments of the power module 2 according to the FIGS. 1 to 4, such as the electrical interference suppression capacitors 5, are arranged in the chamber 33 (FIG. 3) confined laterally by the connection parts 27, 28 and the extending walls 26, the printed circuit board 3 and the epoxy resin layer 30. The remaining large components, for example the DC intermediary circuit capacitors 4 and the throttle coil 6, however, are arranged outside the chamber 33 in the chamber 34 (FIGS. 1 and 3) of the lower housing part 10.

As the housing formed by the housing parts 10 and 13 is made of metal, preferably aluminium, and the electrically isolating, however, very well heat conducting printed circuit boards 20, 21 rest on the wall 11 of the cooled housing part 10 in an immediately heat conducting way, the power module 2 is not only sufficiently cooled, but also safely fixed mechanically. Additionally, the printed circuit boards 3 and 8 are also safely fixed by the connection parts 27 and 28.

Even though the embodiments of the power module 2 according to the FIGS. 1 to 4 have two separate printed circuit boards 20, 21, it is also possible to replace these two printed circuit boards by one single printed circuit board.

In the third embodiment of the power module 2 according to FIG. 5 an external terminal block 35 with connecting parts for the current supply mains, the load (motor), a braking resistor, DC intermediary circuit component and low-current signals, like measuring and control signals, is immediately integrated in the housing 19 of the power module 2. The connection parts 27 lead direct down to the printed circuit board 3 and are soldered onto it. Besides, the housing 19 of the power module 2 also comprises the printed circuit boards 20, 21 (not shown in FIG. 5). Further large components, like capacitors 5, 37 and relays, are soldered into the chamber between the printed circuit board 3 and the power module 2. Outside this chamber, intermediary circuit coils 38 are connected on the printed circuit board 3 next to the capacitors 4.

In the embodiments according to the FIGS. 1 and 5, the power module 2 and the printed circuit board 3 arranged over it are connected in one single soldering process. As opposed to the state of the art, this means that both parts are electrically connected in one working process, as the printed circuit board 3 is equipped with the power module 2 and led through a soldering tin bath.

What is claimed is:

1. A current converter with a housing including a first printed circuit board and a power module, the power module including at least one second printed circuit board having power components, said second printed circuit board making a heat-conducting connection to a wall of the current converter housing serving as a heat sink, the power module having electrically conducting connecting parts extending perpendicular with respect to the housing wall of the current converter, said connecting parts are embedded in electrically non-conducting solid walls of the power module the solid walls providing mechanical support for the first printed circuit board and defining a chamber between the first printed circuit board and the power module, the chamber accommodating, passive electrical components and the only electrical connection between the power module and other electrical components of the current converter being made by way of the said connecting parts.

2. Current converter according to claim 1, in which the power module further includes control components, the power components and control components being arranged on an equal level on the second printed circuit board.

3. Current converter according to claim 2, in which the housing wall of the current converter serving as a heat sink has a cut out, in which at least some of the control components are arranged to be thermally isolated from the power components.

4. Current converter according to claim 3, in which the control components are arranged on both sides of the second printed circuit board.

5. Current converter according to claim 1, in which the printed circuit boards are made of ceramic with printed copper conductors.

6. A current converter with a housing including a first printed circuit board and a power module, the power module including at least one second printed circuit board having power components, said second printed circuit board making a heat-conducting connection to a wall of the current converter housing serving as a heat sink, the power module having electrically conducting connecting parts extending perpendicular with respect to the housing wall of the current converter, said connecting parts are connected to the first printed circuit board and defining a chamber between the first printed circuit board and the power module for accommodation of, passive electrical components, the housing of the power module being electrically non-conducting and having a connector for an electrical supply means and an electrical load, said connector being accessible from outside of the current converter and being connected to the connecting parts.

* * * * *